(12) United States Patent
Yang et al.

(10) Patent No.: US 10,141,897 B2
(45) Date of Patent: Nov. 27, 2018

(54) SOURCE FOLLOWER

(71) Applicant: SILICON INTEGRATED SYSTEMS CORP., Hsinchu (TW)

(72) Inventors: Ssu-Che Yang, Hsinchu (TW); Wen-Chi Lin, Hsinchu (TW); Keng-Nan Chen, Hsinchu (TW)

(73) Assignee: SILICON INTERGRATED SYSTEMS CORP., Hsinchu (TW)

( * ) Notice: Subject to any disclaimer, the term of this patent is extended or adjusted under 35 U.S.C. 154(b) by 0 days.

(21) Appl. No.: 15/831,220

(22) Filed: Dec. 4, 2017

(65) Prior Publication Data
US 2018/0159485 A1 Jun. 7, 2018

(30) Foreign Application Priority Data

Dec. 7, 2016 (TW) .............................. 105140521 A

(51) Int. Cl.
| | |
|---|---|
| H03F 1/14 | (2006.01) |
| H03F 1/34 | (2006.01) |
| H03F 1/32 | (2006.01) |
| H03F 3/345 | (2006.01) |
| H03F 3/50 | (2006.01) |
| H03K 5/02 | (2006.01) |
| H03F 3/347 | (2006.01) |

(52) U.S. Cl.
CPC ........... *H03F 1/342* (2013.01); *H03F 1/3205* (2013.01); *H03F 3/345* (2013.01); *H03F 3/347* (2013.01); *H03F 3/505* (2013.01); *H03K 5/023* (2013.01); *H03F 2200/135* (2013.01); *H03F 2203/5012* (2013.01)

(58) Field of Classification Search
CPC ..................................... H03F 1/14; H03F 3/45
USPC ......................................... 330/290, 257, 261
See application file for complete search history.

(56) References Cited

U.S. PATENT DOCUMENTS

| | | | | |
|---|---|---|---|---|
| 7,274,256 B2* | 9/2007 | Ricotti | .................. | H03F 3/3022 330/255 |
| 7,514,966 B2* | 4/2009 | Ho | ....................... | H03K 5/2481 327/53 |
| 7,663,439 B2* | 2/2010 | Chang | ..................... | H03F 1/086 330/255 |
| 8,913,050 B2* | 12/2014 | Shishido | .................. | G01J 1/02 345/207 |
| 2017/0338823 A1* | 11/2017 | Reinhold | ......... | G01R 19/16585 |

* cited by examiner

*Primary Examiner* — Henry Choe
(74) *Attorney, Agent, or Firm* — Maschoff Brennan

(57) ABSTRACT

A source follower includes a first transistor, a first output module, a second transistor, a second output module and a feedback module. The first terminal and the control terminal of the first transistor are configured to respectively receive a first base voltage and a first control voltage. The second terminal of the first transistor and the first output module are electrically connected to a first output terminal. The first terminal and the control terminal of the second transistor are configured to respectively receive a first base voltage and a second control voltage. The second terminal of the second transistor and the second output module are electrically connected to a second output terminal. The feedback module is electrically connected to the control terminal of the first transistor, the control terminal of the second transistor and a reference node of the second output module.

12 Claims, 2 Drawing Sheets

US 10,141,897 B2

SOURCE FOLLOWER

CROSS-REFERENCE TO RELATED APPLICATIONS

This non-provisional application claims priority under 35 U.S.C. § 119(a) on Patent Application No(s). 105140521 filed in Taiwan, R.O.C. on Dec. 7, 2016, the entire contents of which are hereby incorporated by reference.

TECHNICAL FIELD

The disclosure relates to a source follower, more particularly to a source follower having a feedback circuit.

BACKGROUND

According to conventional circuit designs, a circuit of source follower is generally equipped in the front end of a programmable gain amplifier (PGA). For a programmable gain amplifier, an output resistance supplied by a front circuit of a circuit with a source follower is lower than an output resistance supplied by a front circuit of a circuit without a source follower. In an implementation, metal-oxide-semiconductor field-effect transistors (MOSFETs) may be used as a buffer and converted impedance in a source follower. However, since components in the source follower may deteriorate due to the effects of process, voltage and temperature (PVT), the source follower outputs unexpected voltage and current. Therefore, the overall efficiency of the circuit may be degraded.

SUMMARY

A source follower is disclosed in the present disclosure. The source follower has a first transistor, a first output module, a second transistor, a second output module and a feedback module. A first terminal of the first transistor is configured to receive the first base voltage and a second terminal of the first transistor is electrically connected to a first output terminal. A control terminal of the first transistor is configured to receive a first control voltage. The first transistor is configured to generate a first current according to the first control voltage. The first output module is electrically connected to the first output terminal. The first output module provides an output voltage to the first output terminal according to the input voltage signal and the first current. A first terminal of the second transistor is configured to receive the first base voltage and a second terminal of the second transistor is electrically connected to the second output terminal. A control terminal of the second transistor is configured to receive the first control voltage. The second transistor is configured to generate a second current according to the first control voltage. The second output module is electrically connected to the second output terminal. The second output module provides a common-mode voltage to the second output terminal according to the second base voltage and the second current. The feedback module is electrically connected to the control terminal of the first transistor, the control terminal of the second transistor and the reference node in the second output module. The feedback module is configured to regulate a voltage level of the reference node and a voltage level of the first control voltage according to the reference voltage.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
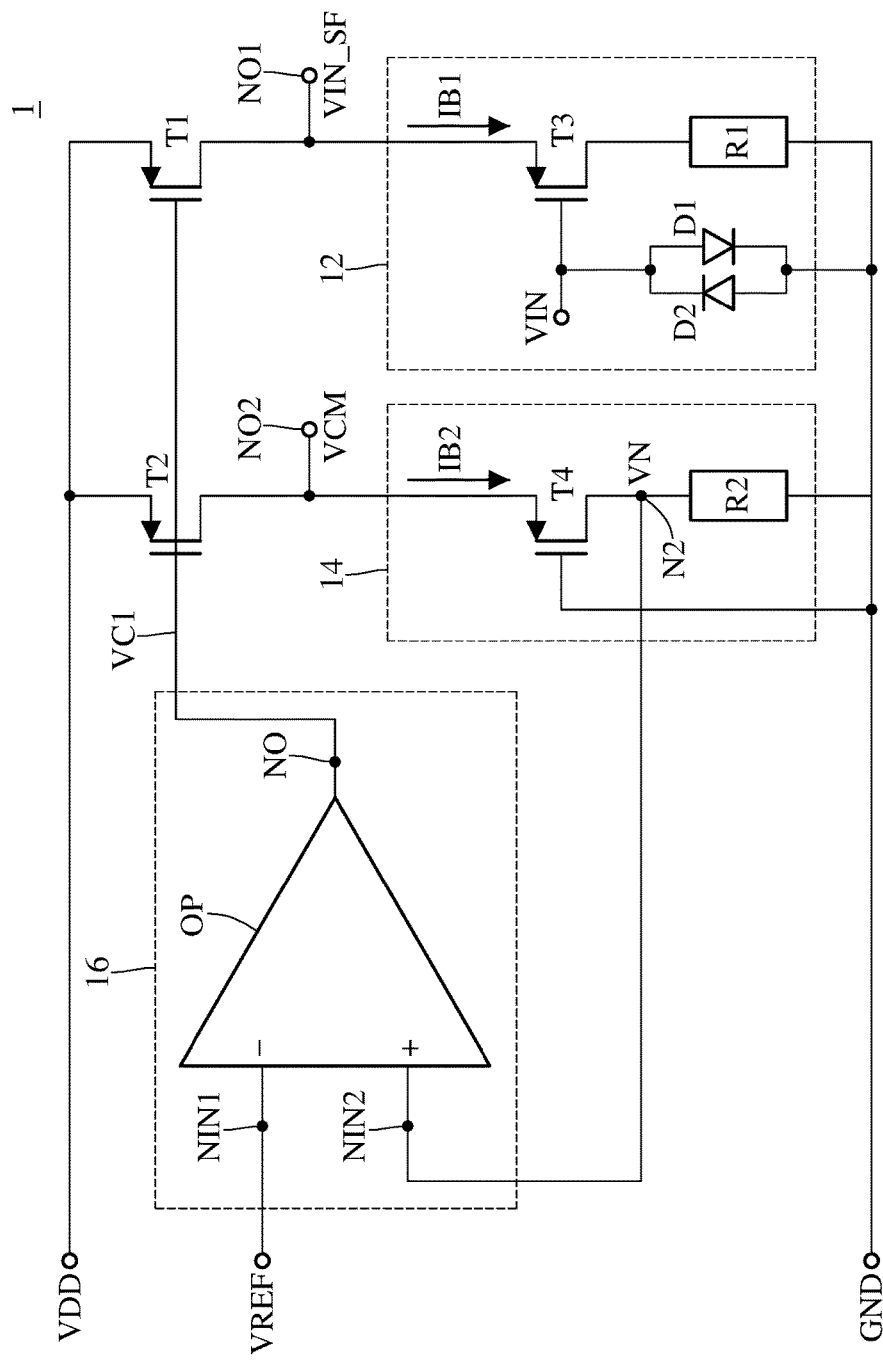
FIG. 1 is a circuit diagram of a source follower according to one embodiment of the present disclosure.

Please refer to FIG. 1, which is a circuit diagram of a source follower according to one embodiment of the present disclosure. As shown in FIG. 1, a source follower 1 has a first transistor T1, a first output module 12, a second transistor T2, a second output module 14 and a feedback module 16.

A first terminal of the first transistor T1 is configured to receive a first base voltage VDD, and a second terminal of the first transistor T1 is electrically connected to a first output terminal NO1. A control terminal of the first transistor T1 is configured to receive a first control voltage VC. The first transistor T1 is configured to generate a first current IB1 according to the first control voltage VC. A first terminal of the second transistor T2 is configured to receive the first base voltage VDD, and a second terminal of the second transistor T2 is electrically connected to a second output terminal NO2. A control terminal of the second transistor T2 is configured to receive the first control voltage VC. The second transistor T2 is configured to generate a second current D32 according to the first control voltage VC. In this embodiment, the first transistor T1 and the second transistor T2 could be P-type metal-oxide-semiconductor field-effect transistors, but the present disclosure is not limited to this embodiment. In an example, the first base voltage VDD has a relatively high voltage level in the system and the second base voltage GND has a relatively low voltage level. The first base voltage VDD is higher than the second base voltage GND. However, the aforementioned type of transistors as well as the voltage levels of those base voltages may be designed by persons having ordinary skills in the art according to actual demands, and the present disclosure is not limited to the above embodiments.

The first output module 12 is electrically connected to the first output terminal NO1, and the first output module 12 provides an output voltage VIN_SF to the first output terminal NO1 according to an input voltage signal VIN and the first current IB1. The second output module 14 is electrically connected to the second output terminal NO2, and the second output module 14 provides a common-mode voltage VCM to the second output terminal NO2 according to the second base voltage GND and the second current B32.

The feedback module 16 is electrically connected to the control terminal of the first transistor T1, the control terminal of the second transistor T2 and the reference node N2 of the second output module 14. The feedback module 16 is configured to regulate the voltage level VN of the reference node N2 and the voltage level of the first control voltage VC according to the reference voltage VREF.

More specifically, in the embodiment of FIG. 1, the first output module 12 has a third transistor T3 and a first resistor R1. The first terminal of the third transistor T3 is electrically connected to the second terminal of the first transistor T1. The control terminal of the third transistor T3 is configured to receive the input voltage signal VIN. A terminal of the first resistor R1 is electrically connected to the second terminal of the third transistor T3, and another terminal of the first resistor R1 is configured to receive the second base voltage GND.

In addition, in an example, the first output module 12 has a first diode D1 and a second diode D2. An anode of the first diode D1 is electrically connected to the control terminal of the third transistor T3, and a cathode of the first diode D1 is configured to receive the second base voltage GND. An anode of the second diode D2 is configured to receive the second base voltage GND, and a cathode of the second diode D2 is electrically connected to the control terminal of the third transistor T3. The first diode D1 and the second diode D2 serve as bias units for supplying voltage to the control terminal of the third transistor T3. It is noted that the first diode D1 and the second diode D2 used as bias units is an alternative design, and the source follower may not have the first diode D1 and the second diode D2. In an example, the first diode D1 and the second diode D2 are poly-silicon diodes.

In an example, the second output module 14 has a fourth transistor T4 and a second resistor R2. A first terminal of the fourth transistor T4 is electrically connected to the second terminal of the second transistor T2, and a control terminal of the fourth transistor T4 is configured to receive the second base voltage GND. A terminal of the second resistor R2 is electrically connected to a second terminal of the fourth transistor T4, and another terminal of the second resistor R2 is configured to receive the second base voltage GND.

In an embodiment, the second output module 14 includes a third diode and a fourth diode. An anode of the third diode is electrically connected to the control terminal of the fourth transistor T4, and a cathode of the third diode is configured to receive the second base voltage GND. An anode of the fourth diode is configured to receive the second base voltage GND, and a cathode of the fourth diode is electrically connected to the control terminal of the fourth transistor T4. The third diode and the fourth diode serve as bias units for supplying voltage to the control terminal of the fourth transistor T4. On the other hand, when the first output module 12 has the first diode D1 and the second diode D2, the second output module 14 has the third diode and the fourth diode as well, so as to increase symmetry of the overall circuit. In an example, the third diode and the fourth diode are poly-silicon diodes.

In the embodiment of FIG. 1, the feedback module 16 includes an operational amplifier OP. A first input terminal NIN1 of the operational amplifier OP is configured to receive a reference voltage VREF. A second input terminal NIN2 of the operational amplifier OP is electrically connected to the reference node N2. An output terminal NO of the operational amplifier OP is electrically connected to the control terminal of the first transistor T1 and the control terminal of the second transistor T2. The operational amplifier OP provides the first control voltage VC through the output terminal NO. In such configuration, based on the feature of virtual short at the amplifier's output terminal, the voltage level VN of reference node N2 is approximately equal to the reference voltage VREF, and the second resistor R2, as a passive component, cannot be significantly affected by process, voltage and temperature, so the current flowing through the second resistor R2 approximately remains constant. On the other hand, the first transistor T1 and the second transistor T2 are paired as a current mirror, so the first current B31 flowing through the first transistor T1 and the third transistor T3 cannot be significantly affected by process, voltage and temperature. By taking the advantage of the aforementioned circuit, the source follower 1 do not come with the problem of voltage drift and current drift caused by the situation that the feature of the fourth transistor T4 changes due to process, voltage and temperature.

Figure 2:
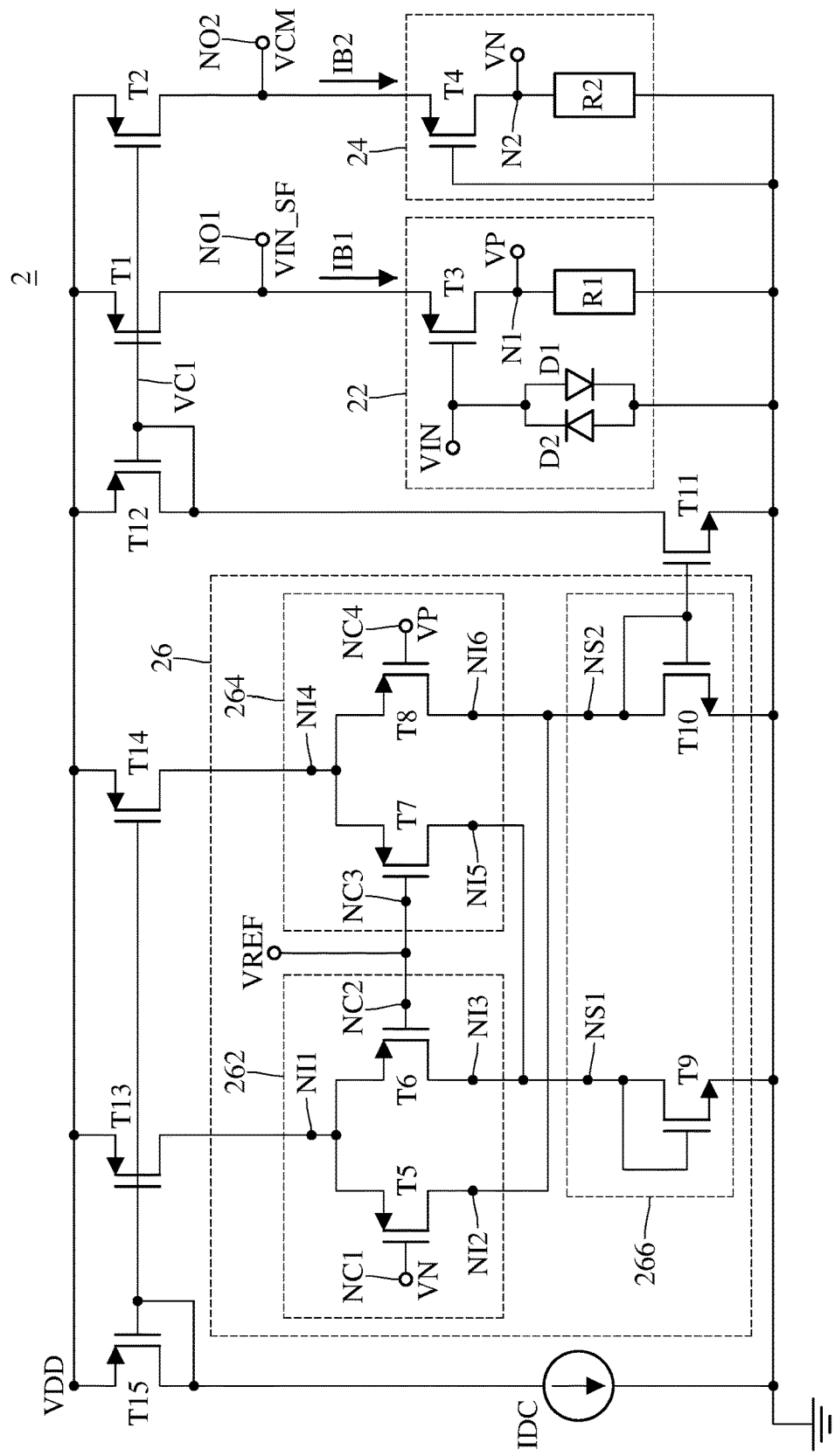
FIG. 2 is a circuit diagram of a source follower according to another embodiment of the present disclosure.

Please refer to FIG. 2, which is a circuit diagram of a source follower according to another embodiment of the present disclosure. As shown in FIG. 2, a source follower 2 has a first transistor T1, a first output module 22, a second transistor T2, a second output module 24 and a feedback module 26. The circuit structure and connections between the first transistor T1, the first output module 22, the second transistor T2 and the second output module 24 are similar to that in the embodiment of FIG. 1, so not repeated here. In the embodiment of FIG. 2, the first output module 22 has a reference node N1, and the reference node N1 has a voltage level VP. The feedback module 26 is electrically connected to the reference node N1, and the feedback module 26 regulates the voltage level VP of the reference node N1 according to the reference voltage VREF. In the embodiment of FIG. 2, the feedback module 26 has a first differential pair 262, a second differential pair 264 and a bus unit 266. The first differential pair 262, the second differential pair 264 as well as the bus unit 266 would be illustrated respectively in the following descriptions.

The first differential pair 262 has a first control terminal NC1, a second control terminal NC2, the first current terminal NI1, the second current terminal NI2 and the third current terminal NI3. The first control terminal NC1 is electrically connected to the reference node N2. The second control terminal NC2 is configured to receive the reference voltage VREF. The first differential pair 262 is configured to control the current flowing through the first current terminal NI1, the current flowing through the second current terminal NI2 and the current flowing through the third current terminal NI3 according to the voltage level of the first control terminal NC1 and the voltage level of the second control terminal NC2. More specifically, in an example, the first differential pair 262 has a fifth transistor T5 and a sixth transistor T6. The first terminal of the fifth transistor T5 is electrically connected to the first current terminal NI1, and the second terminal of the fifth transistor T5 is electrically connected to the second current terminal N12. The control terminal of the fifth transistor T5 is electrically connected to the first control terminal NC1. A first terminal of the sixth transistor T6 is electrically connected to the first current terminal NI1, and a second terminal of the sixth transistor T6 is electrically connected to the third current terminal NI3. A control terminal of the sixth transistor T6 is electrically connected to the second control terminal NC2. The current flowing through the first current terminal NI1 is approximately the same as the sum of the currents flowing through the second current terminal NI2 and the third current terminal NI3. The relation between the voltage level of the first control terminal NC1 and the voltage level of the second control terminal NC2 is related to the proportion between the currents flowing through the second current terminal NI2 and the third current terminal N13.

The second differential pair 264 has a third control terminal NC3, a fourth control terminal NC4, a fourth current terminal N14, a fifth current terminal NI5 and a sixth current terminal N16. The third control terminal NC3 is configured to receive the reference voltage VREF. The fourth control terminal NC4 is electrically connected to the reference node N1. The second differential pair 264 is configured to control the current flowing through the fourth current terminal NI4, the current flowing through the fifth current terminal NI5 and the current flowing through the sixth current terminal NI6 according to a voltage level of the third control terminal NC3 and a voltage level of the fourth control terminal NC4. More specifically, in an example, the second differential pair 264 has a seventh transistor T7 and an eighth transistor T8. A first terminal of the seventh transistor T7 is electrically connected to the fourth current terminal NI4, and a second terminal of the seventh transistor T7 is electrically connected to the fifth current terminal NI5. A control terminal of the seventh transistor T7 is electrically connected to the third control terminal NC3. A first terminal of the eighth transistor T8 is electrically connected to the fourth current terminal NI4, and a second terminal of the eighth transistor T8 is electrically connected to the sixth current terminal NI6. A control terminal of the eighth transistor T8 is electrically connected to the fourth control terminal NC4. The current flowing through the fourth current terminal NI4 is approximately the same as the sum of the currents flowing through the fifth current terminal NI5 and the sixth current terminal NI6. The relation between the voltage level of the third control terminal NC3 and the voltage level of the fourth control terminal NC4 is related to the proportion between the currents flowing through the fifth current terminal NI5 and the sixth current terminal NI6.

The bus unit 266 is electrically connected to the control terminal of the first transistor T1 and the control terminal of the second transistor T2. The bus unit 266 has a first bus terminal NS1 and a second bus terminal NS2. The first bus terminal NS1 is electrically connected to the third current terminal NI3 and the fifth current terminal NI5. The second bus terminal NS2 is electrically connected to the second current terminal NI2 and the sixth current terminal NI6. The bus unit 266 is configured to control the current flowing through the first transistor T1 and the current flowing through the second transistor T2 according to the current flowing through the second current terminal NI2, the current flowing through the third current terminal NI3, the current flowing through the fifth current terminal NI5 and the current flowing through the sixth current terminal NI6.

More specifically, in an example, the bus unit 266 has a ninth transistor T9 and a tenth transistor T10. A first terminal of the ninth transistor T9 is electrically connected to the first bus terminal NS1, and a second terminal of the ninth transistor T9 is configured to receive the second base voltage GND. A control terminal of the ninth transistor T9 is electrically connected to the first bus terminal NS1. A first terminal of the tenth transistor T10 is electrically connected to the second bus terminal NS2, and a second terminal of the tenth transistor T10 is configured to receive the second base voltage GND. A control terminal of the tenth transistor T10 is electrically connected to the second bus terminal NS2. From another point of view, the ninth transistor T9 is configured to merge the current flowing through the sixth transistor T6 with the current flowing through the seventh transistor T7, and the tenth transistor T10 is configured to merge the current flowing through the fifth transistor T5 with the current flowing through the eighth transistor T8.

In addition to the aforementioned components, the source follower 2 has an eleventh transistor T11 and a twelfth transistor T12. A second terminal of the eleventh transistor T11 is configured to receive the second base voltage GND. A control terminal of the eleventh transistor T11 is electrically connected to the control terminal of the tenth transistor T10. A first terminal of the twelfth transistor T12 is configured to receive the first base voltage VDD, and a second terminal of the twelfth transistor T12 is electrically connected to a first terminal of the eleventh transistor T11. A control terminal of the twelfth transistor T12 is electrically connected to the second terminal of the twelfth transistor T12. The control terminal of the twelfth transistor T12 is electrically connected to the control terminal of the first transistor T1 and the control terminal of the second transistor T2. The twelfth transistor T12 is configured to form a current mirror with the first transistor T1, and the twelfth transistor T12 is configured to form another current mirror with the second transistor T2. The eleventh transistor T11 is configured to be paired with the tenth transistor 10 in the bus unit 266 to form a current mirror, which is considered as a current source to supply current to the twelfth transistor T12.

The source follower 2 has a thirteenth transistor T13, a fourteenth transistor T14, a fifteenth transistor T15 and a current source IDC. A first terminal of the thirteenth transistor T13 is configured to receive the first base voltage VDD. A second terminal of the thirteenth transistor T13 is electrically connected to the first current terminal NI1. A first terminal of the fourteenth transistor T14 is configured to receive the first base voltage VDD, and a second terminal of the fourteenth transistor T14 is electrically connected to the fourth current terminal NI4. A first terminal of the fifteenth transistor T15 is configured to receive the first base voltage VDD, and a second terminal of the fifteenth transistor T15 is electrically connected to a terminal of the current source IDC. A control terminal of the fifteenth transistor T15 is electrically connected to the control terminal of the thirteenth transistor T13, the control terminal of the fourteenth transistor T14 and the second terminal of the fifteenth transistor T15. Another terminal of the current source IDC is configured to receive the second base voltage GND. The fifteenth transistor T15 is paired with the thirteenth and fourteenth transistors T13, T14 respectively to form a current mirror used for supplying currents to the first differential pair 262 and the second differential pair 264.

Based on the above description, the source follower of the present disclosure has a feedback module, and the source follower has at least one resistor serving as a passive component. By taking the advantage of disposing the feedback module and resistor(s) as shown in the configurations of the aforementioned embodiments, the source follower is capable of stabilizing the output current. Even though the deterioration of the components and the changes of features of the components are caused by process, voltage and temperature, the current output by the source follower still remains stable. Therefore, the process, voltage and temperature would not significantly affect the current of the source follower.

What is claimed is:

1. A source follower, comprising:
    a first transistor having a first terminal, a second terminal and a control terminal, with the first terminal of the first transistor configured to receive a first base voltage, the second terminal of the first transistor electrically connected to a first output terminal, the control terminal of the first transistor configured to receive a first control voltage, and the first transistor configured to generate a first current according to the first control voltage;
    a first output module electrically connected to the first output terminal and providing an output voltage to the first output terminal according to an input voltage signal and the first current;

a second transistor having a first terminal, a second terminal and a control terminal, with the first terminal of the second transistor configured to receive the first base voltage, the second terminal of the second transistor electrically connected to a second output terminal, the control terminal of the second transistor configured to receive the first control voltage and the second transistor configured to generate a second current according to the first control voltage;

a second output module electrically connected to the second output terminal and providing a common-mode voltage to the second output terminal according to a second base voltage and the second current; and a feedback module electrically connected to the control terminal of the first transistor, the control terminal of the second transistor and a reference node in the second output module, the feedback module configured to regulate a voltage level of the reference node and a voltage level of the first control voltage according to a reference voltage, wherein the feedback module comprising:

an amplifier, with a first input terminal of the amplifier configured to receive the reference voltage, a second input terminal of the amplifier electrically connected to the reference node, an output terminal of the amplifier electrically connected to the control terminal of the first transistor and the control terminal of the second transistor, and the amplifier providing the first control voltage through the output terminal.

2. The source follower according to claim 1, wherein the first output module has another reference node, the feedback module is electrically connected to said another reference node, the feedback module regulates a voltage level of said another reference node according to the reference voltage, and the feedback module further comprises:

a first differential pair having a first control terminal, a second control terminal, a first current terminal, a second current terminal and a third current terminal, with the first control terminal electrically connected to the reference node, the second control terminal configured to receive the reference voltage, the first differential pair configured to control current flowing through the first current terminal, the second current terminal and the third current terminal according to a voltage level of the first control terminal and a voltage level of the second control terminal;

a second differential pair having a third control terminal, a fourth control terminal, a fourth current terminal, a fifth current terminal and a sixth current terminal, with the third control terminal configured to receive the reference voltage, the fourth control terminal electrically connected to said another reference node, and the second differential pair configured to control current flowing through the fourth current terminal, the fifth current terminal and the sixth current terminal according to a voltage level of the third control terminal and a voltage level of the fourth control terminal; and a bus unit electrically connected to the first transistor and the second transistor and having a first bus terminal and a second bus terminal, with the first bus terminal electrically connected to the third current terminal and the fifth current terminal, the second bus terminal electrically connected to the second current terminal and the sixth current terminal, the bus unit configured to control current flowing through the first transistor and current flowing though the second transistor according to current flowing through the third current terminal, current flowing through the fourth current terminal, current flowing through the fifth current terminal and current flowing through the sixth current terminal.

3. The source follower according to claim 2, wherein the first differential pair comprises a fifth transistor and a sixth transistor, the second differential pair comprises a seventh transistor and a eighth transistor, a first terminal of the fifth transistor is electrically connected to the first current terminal, a second terminal of the fifth transistor is electrically connected to the second current terminal, a control terminal of the fifth transistor is electrically connected to the first control terminal, a first terminal of the sixth transistor is electrically connected to the first current terminal, a second terminal of the sixth transistor is electrically connected to the third current terminal, a control terminal of the sixth transistor is electrically connected to the second control terminal, a first terminal of the seventh transistor is electrically connected to the fourth current terminal, a second terminal of the seventh transistor is electrically connected to the fifth current terminal, a control terminal of the seventh transistor is electrically connected to the third control terminal, a first terminal of the eighth transistor is electrically connected to the fourth current terminal, a second terminal of the eighth transistor is electrically connected to the sixth current terminal, a control terminal of the eighth transistor is electrically connected to the fourth control terminal.

4. The source follower according to claim 2, wherein the bus unit comprises a ninth transistor and a tenth transistor, a first terminal of the ninth transistor is electrically connected to the bus unit, a second terminal of the ninth transistor is configured to receive the second base voltage, a control terminal of the ninth transistor is electrically connected to the first bus terminal, a first terminal of the tenth transistor is electrically connected to the second bus terminal, a second terminal of the tenth transistor is configured to receive the second base voltage, and a control terminal of the tenth transistor is electrically connected to the second bus terminal.

5. The source follower according to claim 4, further comprising a eleventh transistor and a twelfth transistor, with a second terminal of the eleventh transistor configured to receive the second base voltage, a control terminal of the eleventh transistor is electrically connected to the control terminal of the tenth transistor, a first terminal of the twelfth transistor is configured to receive the first base voltage, a second terminal of the twelfth transistor is electrically connected to a first terminal of the eleventh transistor, a control terminal of the twelfth transistor is electrically connected to the second terminal of the twelfth transistor, and the control terminal of the twelfth transistor is electrically connected to the control terminal of the first transistor and the control terminal of the second transistor.

6. The source follower according to claim 5, further comprising a thirteenth transistor, a fourteenth transistor, a fifteenth transistor and a current source, with a first terminal of the thirteenth transistor configured to receive the first base voltage, a second terminal of the thirteenth transistor electrically connected to the first current terminal, a first terminal of the fourteenth transistor configured to receive the first base voltage, a second terminal of the fourteenth transistor electrically connected to the fourth current terminal, a first terminal of the fifteenth transistor configured to receive the first base voltage, a second terminal of the fifteenth transistor electrically connected to a terminal of the current source, a control terminal of the fifteenth transistor electrically connected to a control terminal of the thirteenth transistor, a control terminal of the fourteenth transistor and the second terminal of the fifteenth transistor, another terminal of the current source configured to receive the second base voltage.

7. The source follower according to claim 1, wherein the first output module comprises:
   a third transistor, with a first terminal of the third transistor electrically connected to the second terminal of the first transistor, a control terminal of the third transistor configured to receive the input voltage signal; and
   a first resistor, with a terminal of the first resistor electrically connected to a second terminal of the third transistor, and another terminal of the first resistor configured to receive the second base voltage.

8. The source follower according to claim 7, wherein the first output module comprises a first diode and a second diode, an anode of the first diode is electrically connected to the control terminal of the third transistor, a cathode of the first diode is configured to receive the second base voltage, an anode of the second diode is configured to receive the second base voltage, a cathode of the second diode is electrically connected to the control terminal of the third transistor.

9. The source follower according to claim 8, wherein the first diode and the second diode are poly-silicon diodes.

10. The source follower according to claim 7, wherein the second output module comprising:
    a fourth transistor, with a first terminal of the fourth transistor electrically connected to the second terminal of the second transistor and a control terminal of the fourth transistor configured to receive the second base voltage; and
    a second resistor, with a terminal of the second resistor electrically connected to the second terminal of the fourth transistor and another terminal of the second resistor configured to receive the second base voltage.

11. The source follower according to claim 10, wherein the second output module comprises a third diode and a fourth diode, an anode of the third diode is electrically connected to the control terminal of the fourth transistor, a cathode of the third diode is configured to receive the second base voltage, an anode of the fourth diode is configured to receive the second base voltage, and a cathode of the fourth diode is electrically connected to the control terminal of the fourth transistor.

12. The source follower according to claim 11, wherein the third diode and the fourth diode are poly-silicon diodes.

* * * * *